United States Patent
Wu et al.

(10) Patent No.: US 11,569,649 B2
(45) Date of Patent: Jan. 31, 2023

(54) SIGNAL SAMPLING CIRCUIT FOR ARC DETECTION

(71) Applicant: DELTA ELECTRONICS, INC., Taoyuan (TW)

(72) Inventors: Chun-Wei Wu, Taoyuan (TW); Chia-Ming Chang, Taoyuan (TW); Xin-Hung Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/445,405

(22) Filed: Aug. 19, 2021

(65) Prior Publication Data
US 2022/0140593 A1    May 5, 2022

(30) Foreign Application Priority Data
Nov. 3, 2020  (TW) ................. 109138314

(51) Int. Cl.
*H02H 1/00* (2006.01)
*G01R 31/12* (2020.01)
*H01H 9/50* (2006.01)
*H02H 3/16* (2006.01)
*H02H 3/10* (2006.01)

(52) U.S. Cl.
CPC ....... *H02H 1/0015* (2013.01); *G01R 31/1272* (2013.01); *H01H 9/50* (2013.01); *H02H 3/105* (2013.01); *H02H 3/16* (2013.01)

(58) Field of Classification Search
CPC ........ H02H 1/0015; H02H 3/16; H02H 3/162; H02H 3/165; H02H 3/105; H01H 9/50

USPC ...................................................... 361/42–50
See application file for complete search history.

(56) References Cited

U.S. PATENT DOCUMENTS

| | | | |
|---|---|---|---|
| 2014/0071564 A1* | 3/2014 | Kim | G01R 31/14 361/42 |
| 2014/0159741 A1 | 6/2014 | Bannwarth et al. | |
| 2016/0116524 A1 | 4/2016 | Putz | |
| 2021/0184449 A1* | 6/2021 | Raisigel | H02H 3/105 |

FOREIGN PATENT DOCUMENTS

| | | |
|---|---|---|
| CN | 203929981 U | 11/2014 |
| TW | 423192 B | 2/2001 |

* cited by examiner

*Primary Examiner* — Danny Nguyen
(74) *Attorney, Agent, or Firm* — CKC & Partners Co., LLC

(57) ABSTRACT

A signal sampling circuit for arc detection includes plural current sensors, plural high pass filter circuits, and an adder circuit. Each of the current sensors is configured to sense a measured current and then generate a sensed voltage signal. One of the high pass filter circuits receives the sensed voltage signal from one of the current sensors and performs high-pass filtering on the sensed voltage signal. The adder circuit performs scaling up, adding, and DC offset on the high-pass filtered sensed voltage signals. Each of the high pass filter circuits is composed of a filter capacitor and a first resistor connected in series with the filter capacitor. The adder circuit is composed of the first resistors, a first operational amplifier, and a second resistor.

18 Claims, 2 Drawing Sheets

SIGNAL SAMPLING CIRCUIT FOR ARC DETECTION

RELATED APPLICATIONS

This application claims priority to Taiwan Application Serial Number 109138314, filed Nov. 3, 2020, the disclosures of which are incorporated herein by reference in their entireties.

BACKGROUND

Field of Invention

The present invention relates to a signal sampling circuit. More particularly, the present invention relates to a signal sampling circuit for arc detection.

Description of Related Art

Regarding the known method for arc detection, a wire is disposed to pass through a current sensing component (i.e., Rogowski coil) so as to detect a measured current flowing through the said single wire, thereby detecting whether an arc occurs by using an arc detection device. However, when the arc detection is applied to the situation with multiple power inputs and multiple wires, plural current sensing components and the corresponding arc detection devices are required, thereby resulting in increasing occupation space.

SUMMARY

The present invention provides a signal sampling circuit for arc detection includes plural current sensors, plural high pass filter circuits, and an adder circuit. Each of the current sensors is configured to sense a measured current and then generate a sensed voltage signal. One of the high pass filter circuits receives the sensed voltage signal from one of the current sensors and performs high-pass filtering on the sensed voltage signal. The adder circuit is configured to perform scaling up, adding, and DC offset on the high-pass filtered sensed voltage signals. Each of the high pass filter circuits is composed of a filter capacitor and a first resistor connected in series with the filter capacitor. The adder circuit is composed of the first resistors, a first operational amplifier, and a second resistor.

In accordance with one or more embodiments of the invention, the first resistors are coupled to an inverted input terminal of the first operational amplifier.

In accordance with one or more embodiments of the invention, the second resistor is coupled between the inverted input terminal and an output terminal of the first operational amplifier.

In accordance with one or more embodiments of the invention, a DC offset voltage is provided to a non-inverted input terminal of the first operational amplifier.

In accordance with one or more embodiments of the invention, a magnification ratio of the adder circuit is a ratio of a resistance of the second resistor to a resistance of the first resistor.

In accordance with one or more embodiments of the invention, a cutoff frequency of each of the high pass filter circuits is determined by a capacitance of the filter capacitor and a resistance of the first resistor.

In accordance with one or more embodiments of the invention, each of the current sensors includes a current transformer.

In accordance with one or more embodiments of the invention, each of the current sensors includes a Rogowski coil.

In accordance with one or more embodiments of the invention, each of the current sensors includes a hall sensor.

In accordance with one or more embodiments of the invention, the signal sampling circuit further includes an amplifier circuit for scaling up an output voltage signal of the adder circuit.

In accordance with one or more embodiments of the invention, the amplifier circuit is composed of a third resistor, a fourth resistor, a second operational amplifier, and a fifth resistor.

In accordance with one or more embodiments of the invention, the third resistor is coupled to a non-inverted input terminal of the second operational amplifier.

In accordance with one or more embodiments of the invention, the fourth resistor is coupled between a node with a DC offset voltage and an inverted input terminal of the second operational amplifier.

In accordance with one or more embodiments of the invention, the fifth resistor is coupled between the inverted input terminal and an output terminal of the second operational amplifier.

In accordance with one or more embodiments of the invention, a magnification ratio of the amplifier circuit is a ratio of a sum of a resistance of the fourth resistor and a resistance of the fifth resistor to the resistance of the fourth resistor.

In accordance with one or more embodiments of the invention, an output voltage signal of the signal sampling circuit is transmitted to a digital signal processor for performing fast Fourier transform, thereby detecting whether an arc occurs based on spectrum analysis.

In accordance with one or more embodiments of the invention, an output voltage signal of the signal sampling circuit is transmitted to a bandpass filter.

In accordance with one or more embodiments of the invention, the DC offset voltage is half of an offset voltage of the first operational amplifier.

In order to let above mention of the present invention and other objects, features, advantages, and embodiments of the present invention to be more easily understood, the description of the accompanying drawing as follows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Specific embodiments of the present invention are further described in detail below with reference to the accompanying drawings, however, the embodiments described are not intended to limit the present invention and it is not intended for the description of operation to limit the order of implementation. The using of "first", "second", "third", etc. in the specification should be understood for identify units or data described by the same terminology, but are not referred to particular order or sequence.

Figure 1:
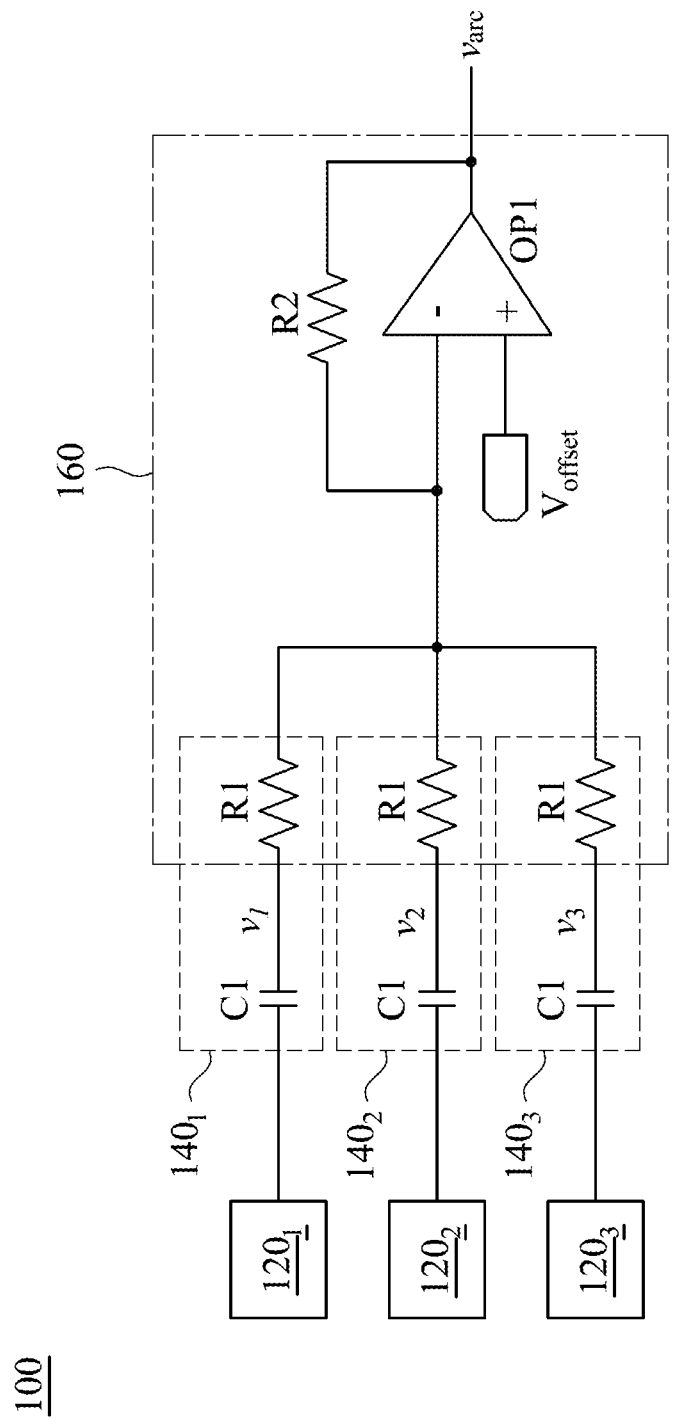
FIG. 1 illustrates a block diagram of a signal sampling circuit for arc detection according to some embodiments of the present invention.

FIG. 1 illustrates a block diagram of a signal sampling circuit 100 for arc detection according to some embodiments of the present invention. The signal sampling circuit 100 includes plural current sensors $120_1$, $120_2$, $120_3$, plural high pass filter circuits $140_1$, $140_2$, $140_3$, and an adder circuit 160. In the embodiment as shown in FIG. 1, the number of the current sensors and the number of the high pass filter circuits are both three, however, the said number is only an example, and the present invention is not limited thereto.

Each of the current sensors $120_1$, $120_2$, $120_3$ senses a measured current flowing through a wire, thereby generating a sensed voltage signal. In some embodiments of the present invention, each of the current sensors $120_1$, $120_2$, $120_3$ may include a sensing component such as a current transformer (CT), a Rogowski coil or a hall sensor. In other words, three wires respectively pass through the current sensors $120_1$, $120_2$, $120_3$ such that each of the current sensors $120_1$, $120_2$, $120_3$ generates the sensed voltage signal.

The current sensors may include different sensing components, and the corresponding electrical components are correspondingly disposed in accordance with the said different sensing components such that the current sensors generate the sensed voltage signals. For example, when the sensing component is the current transformer, each of the current sensors $120_1$, $120_2$, $120_3$ further includes a sampling resistor (not shown) coupled between the current transformer and the high pass filter circuit. The sampling resistor is configured to convert a sensed current signal generated by the current transformer into the sensed voltage signal. For example, when the sensing component is the Rogowski coil, each of the current sensors $120_1$, $120_2$, $120_3$ further includes an electrical component such as integrator (not shown) coupled between the Rogowski coil and the high pass filter circuit. The integrator is configured to convert the measured current flowing through the wire into the sensed voltage signal. For example, when the current sensor is the hall sensor, a signal processing circuit matched with the hall sensor converts the measured current flowing through the wire into the sensed voltage signal, such that the hall sensor outputs the sensed voltage signal.

The high pass filter circuit $140_1$ receives the sensed voltage signal from the current sensors $120_1$, and the high pass filter circuit $140_1$ performs high-pass filtering on the sensed voltage signal so as to allow the high-frequency components of the sensed voltage signal to be passed, thereby outputting the high-pass filtered sensed voltage signal $v_1$. The high pass filter circuit $140_2$ receives the sensed voltage signal from the current sensors $120_2$, and the high pass filter circuit $140_2$ performs high-pass filtering on the sensed voltage signal so as to allow the high-frequency components of the sensed voltage signal to be passed, thereby outputting the high-pass filtered sensed voltage signal $v_2$. The high pass filter circuit $140_3$ receives the sensed voltage signal from the current sensors $120_3$, and the high pass filter circuit $140_3$ performs high-pass filtering on the sensed voltage signal so as to allow the high-frequency components of the sensed voltage signal to be passed, thereby outputting the high-pass filtered sensed voltage signal $v_3$.

As shown in FIG. 1, each of the high pass filter circuits $140_1$, $140_2$, $140_3$ is composed of a filter capacitor C1 and a first resistor R1 connected in series with the filter capacitor C1. A cutoff frequency of the each of the high pass filter circuits $140_1$, $140_2$, $140_3$ is determined by a capacitance of the filter capacitor C1 and a resistance of the first resistor R1. The formula of the cutoff frequency of the high pass filter circuit is shown as follows:

$$f_c = \frac{1}{2\pi R1 C1} \quad (1)$$

$f_c$ is the cutoff frequency of the high pass filter circuit. For example, when the capacitance of the filter capacitor C1 is 1 nanofarad (nf) and the resistance of the first resistor R1 is 10 kilohm (kΩ), the cutoff frequency $f_c$ is 15.9 kilohertz (kHz). In other words, the cutoff frequency $f_c$ of the high pass filter circuit can be changed by adjusting the capacitance of the filter capacitor C1 and the resistance of the first resistor R1. The sensed voltage signals generated by the current sensors $120_1$, $120_2$, $120_3$ may include DC components or other frequency components during normal operation. The said frequency components are not required for arc detection and may affect the accuracy of arc detection. Therefore, the high pass filter circuits $140_1$, $140_2$, $140_3$ are disposed to filter out the undesired frequency components. For example, if the current sensors $120_1$, $120_2$, $120_3$ are used for detecting the currents of the switching power converters, since the switching power converters utilizes switching to convert DC power and/or AC power, the current flowing through the path will have the frequency components of the switching (i.e., the switching frequency). However, the said switching frequency is not the frequency when an arc is occurred. Therefore, in order to avoid the interference during the arc detection, the high pass filter circuits $140_1$, $140_2$, $140_3$ are disposed to filter out the specific switching frequency.

As shown in FIG. 1, the adder circuit 160 is composed of plural first resistors R1, a first operational amplifier OP1, and a second resistor R2. The first resistors R1 are coupled to an inverted input terminal of the first operational amplifier OP1. The second resistor R2 is coupled between the inverted input terminal and an output terminal of the first operational amplifier. A direct current (DC) offset voltage $V_{offset}$ is provided to a non-inverted input terminal of the first operational amplifier OP1.

The adder circuit 160 is configured to perform scaling up, adding, and DC offset on the high-pass filtered sensed voltage signals $v_1$, $v_2$, $v_3$. The formula of a magnification ratio of the adder circuit 160 is shown as follows:

$$v_{arc} = v_1 \frac{R2}{R1} + v_2 \frac{R2}{R1} + v_3 \frac{R2}{R1} \quad (2)$$

$v_{arc}$ is the AC components of the output signal of the adder circuit 160.

Since the amplitudes of the high-pass filtered sensed voltage signals $v_1$, $v_2$, $v_3$ may be relatively small and are not facilitate for arc detecting, the high-pass filtered sensed voltage signals $v_1$, $v_2$, $v_3$ could be scaled up to appropriate amplitudes through the adder circuit 160, in which the said appropriate amplitudes are facilitate for arc detecting. As shown in formula (2), a magnification ratio of the adder circuit 160 is a ratio of a resistance of the second resistor R2 to a resistance of the first resistor R1. For example, when the resistance of the second resistor R2 is 100 kilohm (kΩ) and the resistance of the first resistor R1 is 10 kilohm (kΩ), the magnification ratio of the adder circuit 160 is 10. In other words, the magnification ratio of the adder circuit 160 can be changed by adjusting the resistance of the second resistor R2 and the resistance of the first resistor R1. It is worth noting that $v_{arc}$ in formula (2) merely indicates the AC components of the output signal of the adder circuit 160, and the DC components such as the DC offset voltage is not considered. Since the AC components of the output signal of the adder circuit 160 is required to be considered for arc detection, the present invention is described with the AC components.

Since the high-pass filtered sensed voltage signals $v_1$, $v_2$, $v_3$ have negative values, the DC offset voltage $V_{offset}$ is added, such that the output voltage signal of the adder circuit 160 is always positive values. For example, the DC offset voltage $V_{offset}$ may be half of an offset voltage of the first operational amplifier OP1, that is, if the offset voltage of the first operational amplifier OP1 is 5 volts, then the DC offset voltage $V_{offset}$ may be 2.5 volts. Thereby, the output voltage signal of the adder circuit 160 is identical to a signal that the AC components $v_{arc}$ of the output signal is superposed on the DC offset voltage $V_{offset}$.

In the application embodiments of the signal sampling circuit 100, the output voltage signal of the adder circuit 160 is transmitted to a bandpass filter for performing frequency band selection, and then a digital signal processor performs fast Fourier transform (FFT), thereby detecting whether an arc occurs based on spectrum analysis.

In some embodiments of the present invention, the adder circuit 160 of the signal sampling circuit 100 adds up the high-pass filtered sensed voltage signals $v_1$, $v_2$, $v_3$. Therefore, the present invention does not need plural arc detection devices corresponding to plural current transformer components so as to perform arc detection. Specifically, the signal sampling circuit 100 of the present invention only requires a single arc detection device (composed of the high pass filter circuits 140₁, 140₂, 140₃ and the adder circuit 160) corresponding to the current sensors (the current sensors 120₁, 120₂, 120₃). Therefore, the signal sampling circuit 100 of the present invention could greatly reduce the occupied space.

Figure 2:
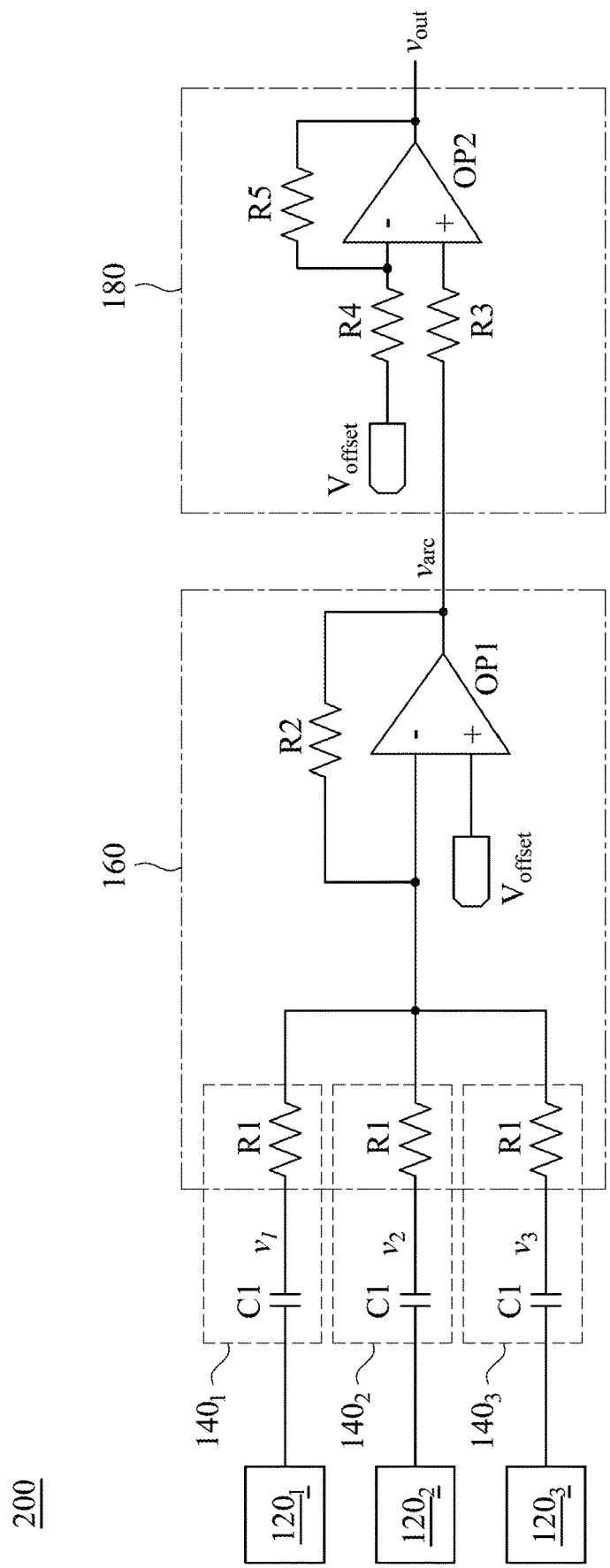
FIG. 2 illustrates a block diagram of a signal sampling circuit for arc detection according to some embodiments of the present invention.

FIG. 2 illustrates a block diagram of a signal sampling circuit 200 for arc detection according to some embodiments of the present invention. The signal sampling circuit 200 is similar to the signal sampling circuit 100. The difference between the signal sampling circuit 100 and the signal sampling circuit 200 is that the signal sampling circuit 200 further includes an amplifier circuit 180. As shown in FIG. 2, the amplifier circuit 180 is composed of a third resistor R3, a fourth resistor R4, a second operational amplifier OP2, and a fifth resistor R5. The third resistor R3 is coupled to a non-inverted input terminal of the second operational amplifier OP2. The fourth resistor R4 is coupled between a node with the DC offset voltage $V_{offset}$ and an inverted input terminal of the second operational amplifier OP2. The fifth resistor R5 is coupled between the inverted input terminal and an output terminal of the second operational amplifier OP2.

The amplifier circuit 180 is configured to scale up the output voltage signal of the adder circuit 160. For ease of description, the present invention is described with the AC components, a magnification ratio that the AC components $v_{arc}$ of the output signal of the adder circuit 160 is transmitted into the amplifier circuit 180 is shown as follows:

$$v_{out} = v_{arc} \frac{R4 + R5}{R4} \quad (3)$$

$v_{out}$ is the AC components of the output signal of the amplifier circuit 180.

Since the amplitude of the AC components $v_{arc}$ of the output voltage signal of the adder circuit 160 may be still relatively small and is not facilitate for arc detecting, the AC components $v_{arc}$ of the output voltage signal of the adder circuit 160 is scaled up to appropriate amplitude through the amplifier circuit 180, in which the said appropriate amplitudes are facilitate for arc detecting. As shown in formula (3), a magnification ratio of the amplifier circuit 180 is a ratio of a sum of a resistance of the fourth resistor R4 and a resistance of the fifth resistor R5 to the resistance of the fourth resistor R4. In other words, the magnification ratio of the amplifier circuit 180 can be changed by adjusting the resistance of the fourth resistor R4 and the resistance of the fifth resistor R5.

In the application embodiments of the signal sampling circuit 100, the output voltage signal of the amplifier circuit 180 is transmitted to a bandpass filter for performing frequency band selection, and then the digital signal processor performs fast Fourier transform (FFT), thereby detecting whether an arc occurs based on spectrum analysis.

In some embodiments of the present invention, the adder circuit 160 of the signal sampling circuit 200 adds up the high-pass filtered sensed voltage signals $v_1$, $v_2$, $v_3$. Therefore, the present invention does not need plural arc detection devices corresponding to plural current transformer components so as to perform arc detection. Specifically, the signal sampling circuit 200 of the present invention only requires a single arc detection device (composed of the high pass filter circuits 140₁, 140₂, 140₃, the adder circuit 160 and the amplifier circuit 180) corresponding to the current sensors (the current sensors 120₁, 120₂, 120₃). Therefore, the signal sampling circuit 200 of the present invention could greatly reduce the occupied space.

From the above description, the present invention provides a signal sampling circuit for arc detection. An adder circuit of the signal sampling circuit adds up the high-pass filtered sensed voltage signals, and therefore the signal sampling circuit of the present invention could greatly reduce the occupied space.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A signal sampling circuit for arc detection, comprising:
   a plurality of current sensors, wherein each of the current sensors is configured to sense a measured current and then generate a sensed voltage signal;
   a plurality of high pass filter circuits, wherein one of the high pass filter circuits receives the sensed voltage signal from one of the current sensors and performs high-pass filtering on the sensed voltage signal; and
   an adder circuit configured to perform scaling up, adding, and DC offset on the high-pass filtered sensed voltage signals;

wherein each of the high pass filter circuits is composed of a filter capacitor and a first resistor connected in series with the filter capacitor;

wherein the adder circuit is composed of the first resistors, a first operational amplifier, and a second resistor.

2. The signal sampling circuit of claim 1, wherein the first resistors are coupled to an inverted input terminal of the first operational amplifier.

3. The signal sampling circuit of claim 1, wherein the second resistor is coupled between the inverted input terminal and an output terminal of the first operational amplifier.

4. The signal sampling circuit of claim 1, wherein a DC offset voltage is provided to a non-inverted input terminal of the first operational amplifier.

5. The signal sampling circuit of claim 1, wherein a magnification ratio of the adder circuit is a ratio of a resistance of the second resistor to a resistance of the first resistor.

6. The signal sampling circuit of claim 1, wherein a cutoff frequency of each of the high pass filter circuits is determined by a capacitance of the filter capacitor and a resistance of the first resistor.

7. The signal sampling circuit of claim 1, wherein each of the current sensors includes a current transformer.

8. The signal sampling circuit of claim 1, wherein each of the current sensors includes a Rogowski coil.

9. The signal sampling circuit of claim 1, wherein each of the current sensors includes a hall sensor.

10. The signal sampling circuit of claim 1, further comprising:

an amplifier circuit for scaling up an output voltage signal of the adder circuit.

11. The signal sampling circuit of claim 10, wherein the amplifier circuit is composed of a third resistor, a fourth resistor, a second operational amplifier, and a fifth resistor.

12. The signal sampling circuit of claim 11, wherein the third resistor is coupled to a non-inverted input terminal of the second operational amplifier.

13. The signal sampling circuit of claim 11, wherein the fourth resistor is coupled between a node with a DC offset voltage and an inverted input terminal of the second operational amplifier.

14. The signal sampling circuit of claim 11, wherein the fifth resistor is coupled between the inverted input terminal and an output terminal of the second operational amplifier.

15. The signal sampling circuit of claim 11, wherein a magnification ratio of the amplifier circuit is a ratio of a sum of a resistance of the fourth resistor and a resistance of the fifth resistor to the resistance of the fourth resistor.

16. The signal sampling circuit of claim 1, wherein an output voltage signal of the signal sampling circuit is transmitted to a digital signal processor for performing fast Fourier transform, thereby detecting whether an arc occurs based on spectrum analysis.

17. The signal sampling circuit of claim 1, wherein an output voltage signal of the signal sampling circuit is transmitted to a bandpass filter.

18. The signal sampling circuit of claim 1, wherein the DC offset voltage is half of an offset voltage of the first operational amplifier.

* * * * *